(12) United States Patent
Hamblin et al.

(10) Patent No.: US 6,175,230 B1
(45) Date of Patent: Jan. 16, 2001

(54) CIRCUIT-BOARD TESTER WITH BACKDRIVE-BASED BURST TIMING

(75) Inventors: Michael W. Hamblin, Stowe; Jak Eskici, Watertown; Anthony J. Suto, Sterling, all of MA (US)

(73) Assignee: GenRad, Inc., Westford, PA (US)

( * ) Notice: Under 35 U.S.C. 154(b), the term of this patent shall be extended for 0 days.

(21) Appl. No.: 09/231,049

(22) Filed: Jan. 14, 1999

(51) Int. Cl.[7] .............................. G01R 31/02; G01R 31/28
(52) U.S. Cl. ....................... 324/158.1; 324/73.1; 714/734
(58) Field of Search .................................. 324/755, 765, 324/158.1, 73.1, 767; 714/734, 29; 361/11

(56) References Cited

U.S. PATENT DOCUMENTS

| | | | |
|---|---|---|---|
| 4,520,416 | 5/1985 | Karash ........................................ | 361/11 |
| 4,554,630 | 11/1985 | Sargent et al. ............................ | 364/200 |
| 4,569,048 | 2/1986 | Sargent ..................................... | 371/16 |
| 4,588,945 | 5/1986 | Groves et al. ....................... | 324/158 R |
| 4,740,895 | 4/1988 | Sargent et al. ............................ | 364/200 |
| 4,827,208 | 5/1989 | Oliver et al. .......................... | 324/73 R |
| 4,856,001 | 8/1989 | McElfresh et al. ...................... | 371/15 |
| 4,862,069 | 8/1989 | Albee ................................... | 324/73 R |
| 4,931,742 | 6/1990 | Karash et al. .......................... | 324/541 |
| 4,973,904 | 11/1990 | Sonnek ................................. | 324/158 R |
| 4,994,732 | 2/1991 | Jeffrey et al. ......................... | 324/73.1 |
| 5,101,150 | 3/1992 | Sullivan et al. ..................... | 324/158 F |
| 5,101,153 | 3/1992 | Morong, III ........................ | 324/158 R |
| 5,124,636 * | 6/1992 | Pincus et al. ........................ | 324/158.1 |
| 5,127,009 | 6/1992 | Swanson ................................. | 371/22.6 |
| 5,144,229 | 9/1992 | Johnsrud et al. .................... | 324/158 R |
| 5,146,159 | 9/1992 | Lau et al. ............................. | 324/158 R |
| 5,235,273 | 8/1993 | Akar et al. ........................... | 324/158 R |
| 5,477,139 * | 12/1995 | West et al. ............................ | 324/158.1 |
| 5,519,331 * | 5/1996 | Cowart et al. ........................ | 324/755 |
| 5,550,844 | 8/1996 | Lucas ..................................... | 371/22.6 |
| 5,602,855 | 2/1997 | Whetsel, Jr. ........................... | 371/22.3 |

OTHER PUBLICATIONS

Ministry of Defence—"Safe Operating Limits for Backdriving"—*Interim Defence Standard Improvement Proposal*, Defence Standard No. 00–53/1, Nov. 15, 1991.

D.S. Morris "The MOD Investigation into Backdriving or Nodeforcing," UK Ministry of Defence (Navy) London, 1987, (no month available).

Hill et al., "Safe Operating Limits for Backdriving in ATE," ERA Technology Ltd., Cleeve Road, Leatherhead, Surrey, KT22 7SA UK, IEEE 1987, (no month available).

Safeguard In–Circuit—"A description of HP's safe implementation of Digital In–circuit test," Hewlett Packard, Product No. 3065–2, Sep., 1985.

* cited by examiner

*Primary Examiner*—Safet Metjahic
*Assistant Examiner*—Minh Tang
(74) *Attorney, Agent, or Firm*—Cesari and McKenna, LLP

(57) ABSTRACT

Pin-driver circuitry in each of an automatic circuit tester (10)'s digital driver/sensor circuits (36) includes a current sensor ($R_{sense}$, QS1, QS2, D1, and D2) and comparison circuit (58) that indicate whether the load current supplied by the driver exceeds a level set by a threshold input (CURRENT_VALUE). The pin-driver circuitry also includes a timer (60) whose output indicates whether the comparison circuit's output has been asserted for a length of time that exceeds a limit set by a duration input (TIME_VALUE). When it has, the tester disables the driver and thereby prevents damage that could otherwise result from excessive backdrive durations that the test-generation process did not anticipate. When no backdriving is sensed during a given burst of test signals, the tester forgoes the normal cool-down delay, thereby speeding the test process.

7 Claims, 5 Drawing Sheets

CIRCUIT-BOARD TESTER WITH BACKDRIVE-BASED BURST TIMING

BACKGROUND OF THE INVENTION

The present invention is directed to automatic circuit-board testing. It particularly concerns digital in-circuit testing.

There is usually a stage in printed-circuit-board manufacture at which the boards are subjected to so-called in-circuit tests. This type of test is performed before any overall functional testing, i.e., before any testing of the board's overall functional characteristics, with which in-circuit testing does not concern itself. In-circuit testing instead focuses on the performance of individual components after they have been placed on the circuit board.

In an in-circuit test, probes contact the board primarily at internal board nodes, typically circuit-board traces, rather than at board terminals. Digital drivers apply signals to some of these traces, and digital sensors determine whether proper signal levels result at these or other similarly probed traces. The ensemble of the digital levels to be applied and/or sensed at all of the test nodes at a given clock time is known as a vector, and the tester includes fast pin memories that together contain codes for a large number of such vectors. A sequencer causes a burst of those codes to be fetched and the resultant levels to be applied to the drivers and sensors at a rapid rate, and the sensors' results are simultaneously loaded back into the pin memories to record the results of the test. Each component's test requires one or more such bursts, so a board containing many components requires many bursts to test it.

Between bursts, the circuit board's components are allowed to cool down and the pin memories are reloaded with new vectors. Tester multiplexers known as "scanners" may also be operated during the inter-burst interval to change the connections between board nodes and digital instruments. (There are typically are many fewer digital instruments than probed nodes, because only a subset of the probed nodes needs to be driven and/or sensed during any individual burst.)

If a circuit board and its components are very simple, then the time required for an in-circuit test may be so small that the most-significant factor affecting tester throughput is the time required to load the board into the tester and remove it again. For most of the more-complex circuit boards, though, the time required for the actual electrical testing can be quite long, so test length has a significant effect on the testing volume of which a given number of board testers are capable.

Unfortunately, the very nature of in-circuit testing tends to make it a slow process. This is a result of the need to isolate individual components during an in-circuit test. Specifically, the board is powered up during an in-circuit test, so components other than the one currently being tested may be attempting to drive a board trace to a level different from the one that the test specifies. Various techniques are employed to minimize other component's tendencies to interfere in this manner; it is often possible to apply signals that will disable those neighbor components, for instance. But not all components can be disabled. Circuit testers typically deal with such components by backdriving, i.e., by driving the node with enough current to overpower the conflicting component.

Although it is possible in principle to make backdrive-capable digital drivers very fast, doing so is usually too expensive to be practical, so backdrive-capable digital drivers ordinarily can operate only at speeds considerably slower than, say, the speeds at which the boards being tested will operate in their intended environment. So it typically is not practical to increase test-vector-application speed significantly. Moreover, the high backdrive currents heat board components up during a burst, so cool-down time must be allowed between bursts.

SUMMARY OF THE INVENTION

We have recognized that a significant reduction in overall test time can be afforded if the digital drivers are provided with current sensors whose outputs are functions of the load currents that those drivers source or sink. The current sensors' outputs indicate whether any backdriving actually occurred during the previous burst. In accordance with our invention, the minimum time intervals between bursts depend on those current sensors' outputs. If the sensors' outputs during a given burst indicate that no backdriving occurred, for instance, the inter-burst interval may be permitted to be as short as the time required by other necessary inter-burst operations, such as pin-memory reloading or scanner reconfiguration. But a minimum cool-down delay will be imposed if the backdriving observed during the previous burst reached a certain level.

Without current-sensor use, a backdrive-dependent cool-down period would not be advisable, because backdriving cannot be predicted reliably during all parts of the test. Differences in component supplier and production lot can cause different boards of the same design to exhibit different backdrive behavior, even if those boards are all good. And a bad board is particularly likely to exhibit unpredictable backdrive behavior. By using current sensors, though, the tester can reliably match the cool-down interval to the actual need for it.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
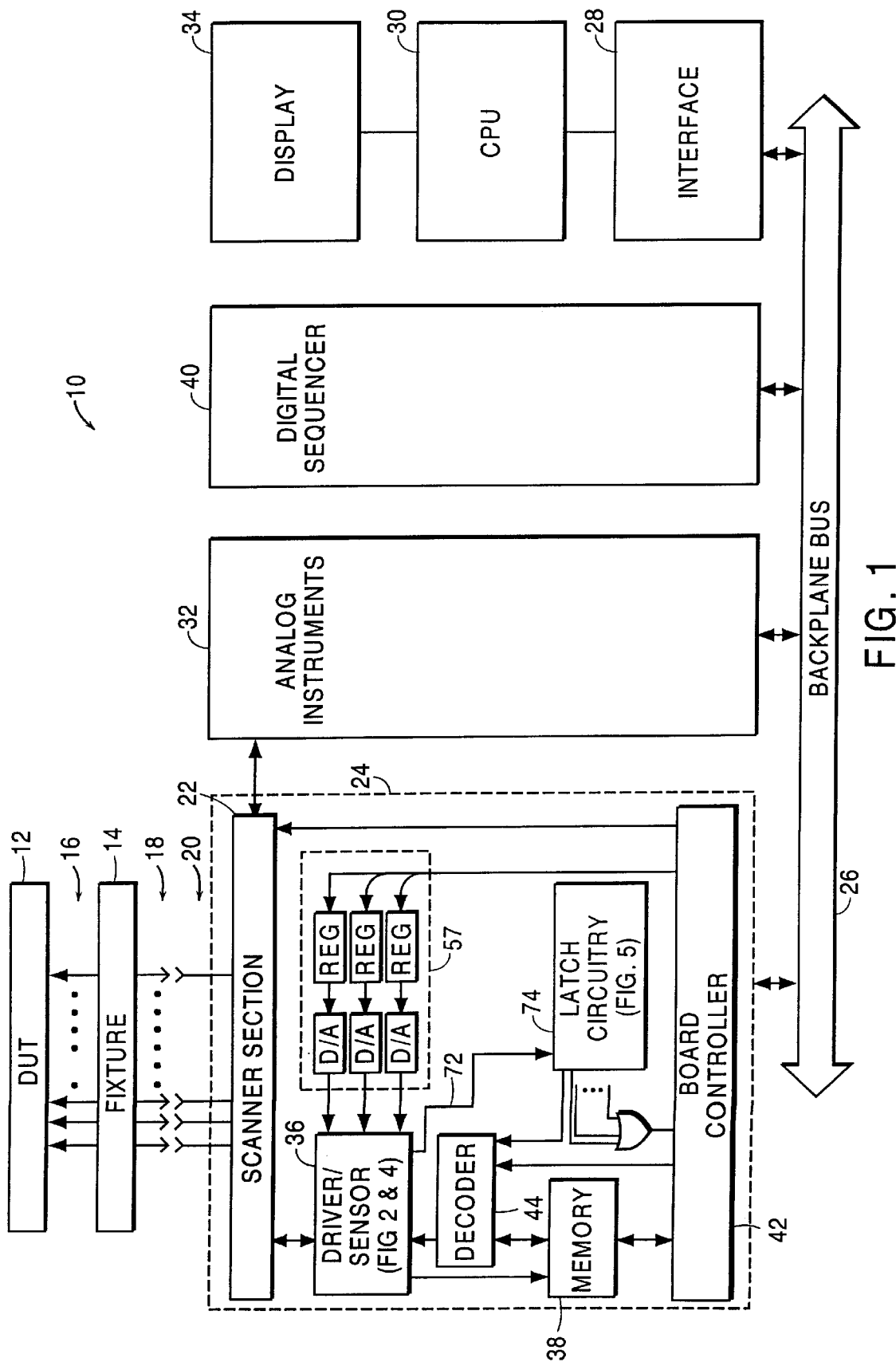
FIG. 1 is a block diagram of an automatic circuit tester that implements the present invention's teachings.

FIG. 1 shows in block-diagram form a test system 10 for testing a circuit board ("device under test") 12. A custom fixture 14 provides access to test points on the device under test 12. Board-side terminals, or "pins," 16 on the fixture 14 are so positioned as to enable them to make simultaneous contact with all of the board test points at which signals are to be applied or sensed in the course of a test. The board-side pins 16 are wired to system-side terminals 18 positioned to engage system terminals 20 of a multiplexor, or "scanner," comprising a plurality of scanner sections that respective pin boards may include. FIG. 1 depicts only a single scanner section 22 provided by a single pin board 24, but a test system more typically includes a plurality of such boards. One or more buses 26 typically connect the pin boards to the rest of the test system.

Through an appropriate interface 28, a central processing unit 30 communicates over bus 26 with analog instruments 32, such as voltmeters and signal generators, to program them for measuring and/or providing signals on test points through the scanner 22 and fixture 14. The instruments 32 may also employ the bus 26 to report measurement results to the central processing unit 30, and the central processing unit 30 may in turn employ a display 34 to provide a human-readable report.

In addition to making analog measurements, the system will also apply bursts of digital signals to various test points and digitally interpret resultant signals at other test points. For this purpose, several the pin boards 24 will include driver-sensor circuits such as circuit 36. Circuit 36's output port is coupled to a respective instrument-side scanner terminal that the scanner selectively couples to fixture-side scanner terminals so that circuit 36 can drive a test point and/or sense the signal on it. (Again, although FIG. 1 shows only a single such circuit, a typical digital circuit tester provides a large number of them, usually several to a pin board.)

A digital-signal test burst typically represents a relatively long sequence of binary values, and the typical high-performance tester includes a respective memory 38 dedicated to each driver-sensor. The memory is typically designed to afford rapid access, because the test burst's digital levels must often change at a high rate. A digital sequencer 40 supplies timing and address signals to the memory 38 through the bus 26 and a board controller 42.

In response to commands received before a test burst from the central processing unit 30, the pin board 24's controller circuitry 42 causes the scanner section 22's internal switches to connect the driver/sensor circuit 36's output port to the desired board test point through the associated system-side fixture terminal 18 and board-side pin 16. Also under control of the central processing unit 30, the controller 42 facilitates the loading of each pin memory 38 with the data required for a single signal burst.

The central processing unit 30 then commands the sequencer 40 to begin a burst. In response, the sequencer causes the pin memory 38 to produce output signals representing the contents of a sequence of pin-memory locations that the sequencer specifies. Each pin-memory location contains a code for one of the functions that the digital driver/sensor can perform. At a minimum, the possible functions are to drive the test point to the high logic level or the low logic level and to sense a high logic level or a low logic level, i.e., to report whether the sensed test point has assumed the expected signal level. The pin memory receives these reported results so that at the end of the burst it indicates whether the test node's responses to all inputs were as expected. Other codes indicate that the driver should be disabled ("tri-stated") or that the sensor should accept either level as correct. There may also be codes for repeating the previous function, toggling levels, and so forth.

Decoder circuitry 44 decodes the memory's output and, with an exception to be explained below, ordinarily complies with those codes in generating level signals that choose between the digital signal levels that the driver/sensor is to drive and/or consider correct. The driver/sensor operates in accordance with the sequence of decoder output signals, applying to the target test node a commanded sequence of logic levels and/or verifying that it exhibits expected signal levels.

Figure 2:
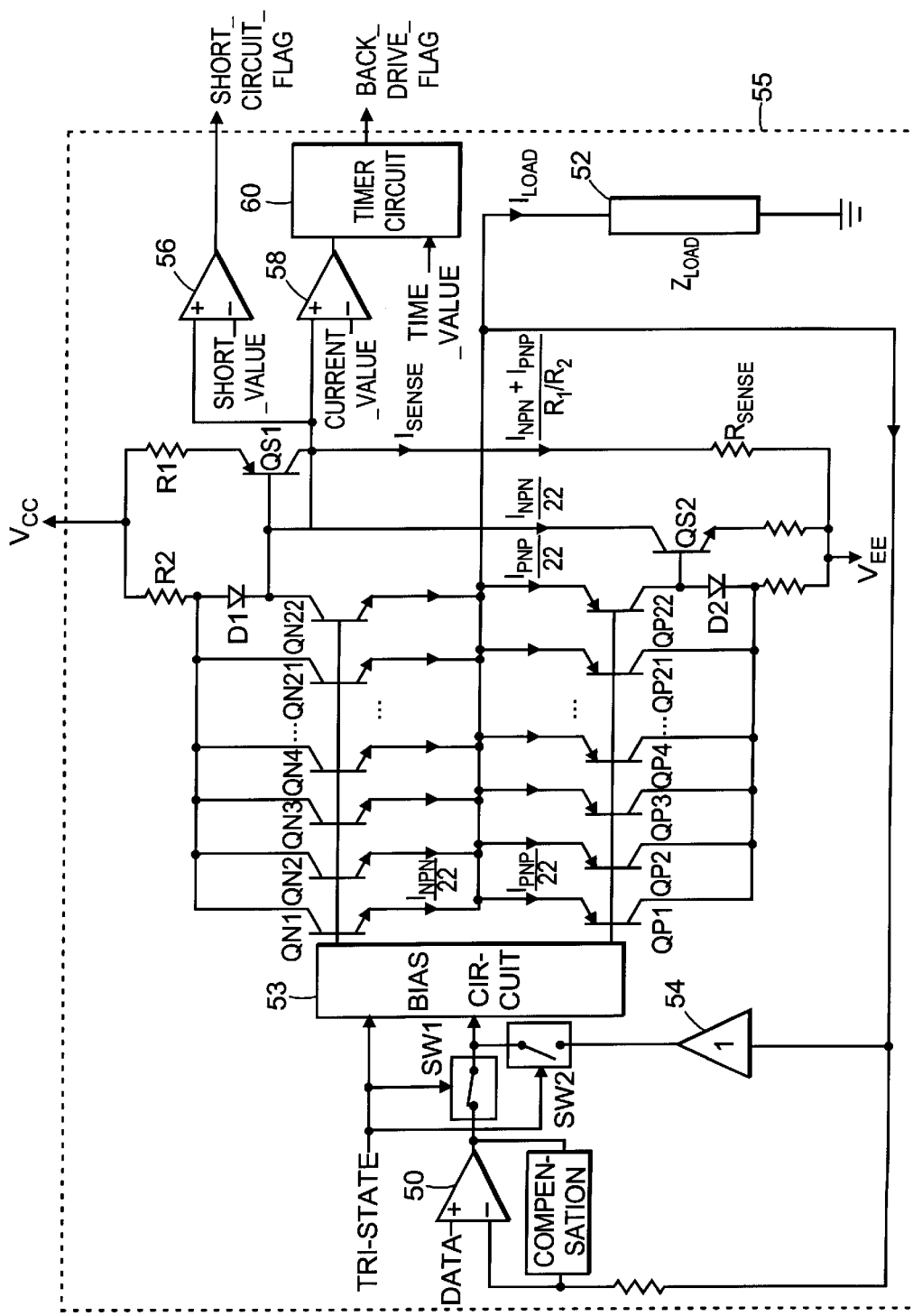
FIG. 2 is a simplified schematic diagram of pin-driver and backdrive-limiting circuitry that FIG. 1's tester employs.

Driver/sensor 36's drive circuitry drives the load current, i.e., serves as a load-current source or sink. The particular type of digital driver circuitry of interest here is the type that is capable of "backdriving," i.e., of driving a load to one logic level despite some board device's attempt to drive it to the other logic level. FIG. 2 depicts in simplified form an example of a backdrive-capable digital driver. To drive the load-current magnitudes sometimes necessary for backdriving, the driver circuitry of FIG. 2 includes twenty-two NPN transistors QN1 through QN22 for sourcing load current and twenty-two PNP transistors QP1 through QP22 for sinking it.

When the code fetched from the pin memory specifies that the associated test point is to be driven, the decoder causes an analog multiplexor, not shown, to forward as the DATA signal one of two reference voltages. Amplifier 50 amplifies the difference between this level and the voltage on the load 52 and so applies the result through appropriate bias circuitry 53 to the bases of transistors QN1 through QN22 and QP1 through QP22 as to drive the load to the DATA signal's voltage level. When the fetched code indicates that the driver is not to be active, i.e., that it is to be tri-stated, the decoder asserts a TRI_STATE signal. That signal operates electronic switches SW1 and SW2 to states in which they isolate the drive transistors' bases from amplifier 50 and instead apply to them the output of a unity-gain buffer amplifier 54, which thereby keeps the drive transistors' base voltages equal to their emitter voltages. This keeps the drive transistors turned off but minimizes the delay encountered in turning them on again.

The tester architecture described so far is only one example of the type of board tester in which the teachings presently to be described can be practiced, and those skilled in the art will recognize that those teachings are applicable to tester architectures that vary significantly from this example. In particular, different embodiments' digital drivers may differ quite significantly from that of FIG. 2. But all will have some digital drivers that are capable of driving current levels needed for backdriving but dangerous to apply for too long a time.

The conventional response to this danger has been to design only test-signal bursts that should not result in excessive backdriving duration. But this approach has two drawbacks. One results from the fact that component specifications can vary from supplier to supplier and from lot to lot; the design constraints necessary to accommodate the combination of all worst-case good-component values often make it extremely difficult to design an effective test. The other drawback is that even a test that would prevent excessive backdriving in the worst-case good board can permit it on a bad board. So even the most-conservative test-design rules can still produce tests that cause excessive current drive.

With the approach about to be described, the test designer still will typically design the test with backdrive limitations, but these limitations will not have to be so strict as to accommodate all worst-case combinations. Instead, the test designer will can relax constraints enough to make an effective test and then rely on test-time detection of excessive overdriving to interrupt or otherwise limit the burst's backdriving if such overdriving occurs. The test designer can do this because of a mechanism that the illustrated embodiment implements in a current sensor and timer.

Figure 3:
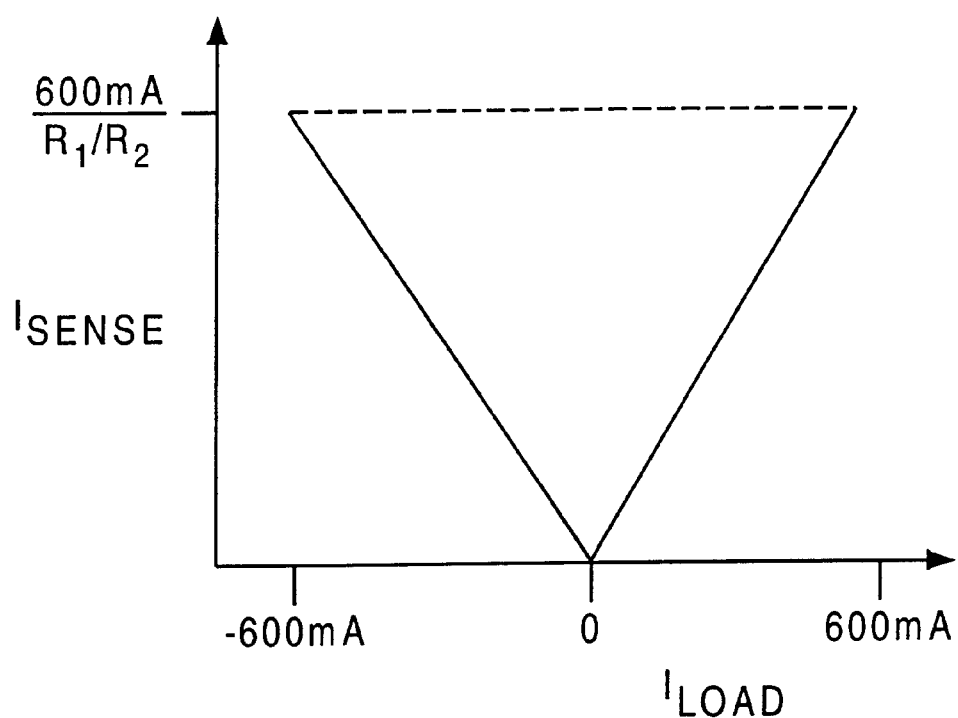
FIG. 3 is a plot of FIG. 2's sensor-circuitry output voltage as a function of load current.

We first consider the current sensor. The driver/sensor circuitry includes a current sensor that includes transistors QS1 and QS2, diodes D1 and D2, and a sensor output resistor $R_{sense}$. As will now be explained, these components cause a voltage across $R_{sense}$ that is proportional to the magnitude of the current that the driver sources or sinks: the $R_{sense}$ voltage bears the FIG. 3 relationship to the load current.

When the driver is sourcing current, the upper drive transistors QN1 through QN22 conduct, but the lower drive transistors do not. So no current flows through diode D2 in QP22's collector circuit, QS2 is turned off, and diode D1's current can flow only into QN22's collector. Now, all of the FIG. 2 circuitry except the load 52 is provided on the same integrated circuit 55, so its P-N junctions' characteristics can be matched very closely. Consequently, QS1's base-emitter junction voltage very nearly equals D1's. This means that resistor R1's current is proportional to R2's and, if QS1's base current can be neglected, to the total of the NPN drive transistors' collector currents. So QS1's collector current, and thus the sensor output voltage across $R_{sense}$, are proportional to the driver's output current.

When the driver operates to sink current rather than source it, the upper, NPN drive transistors are turned off, but the lower, PNP drive transistors are turned on. In that situation, D1's current can flow only through QS2, whose current is proportional to that of the PNP drive transistors just as QS1's is to that of the NPN drive transistors. So D1's and QS1's currents are again proportional to that of the drive transistors, and the $R_{sense}$ voltage is again indicative of the load-current magnitude.

In addition to using this sensor for back-drive limiting in a manner presently to be described, the illustrated embodiment also uses it to tell when the driver output is essentially shorted and should be turned off immediately to avoid damage. To this end, a comparator 56 asserts a SHORT_CIRCUIT_FLAG signal if the $R_{sense}$ voltage exceeds a threshold SHORT_VALUE set by FIG. 1's limit-setting circuitry 57. As will be explained presently, SHORT_CIRCUIT_FLAG's assertion results in the driver's immediately being tri-stated. Before a burst begins, the central processing unit 30 sets SHORT_VALUE as well as other analog values by communicating with the limit-setting circuitry 57 through the board controller 42. Circuit 57 includes registers that store analog representations of those values. It also includes digital-to-analog converters that convert the stored values to the required analog voltages.

Figure 4:
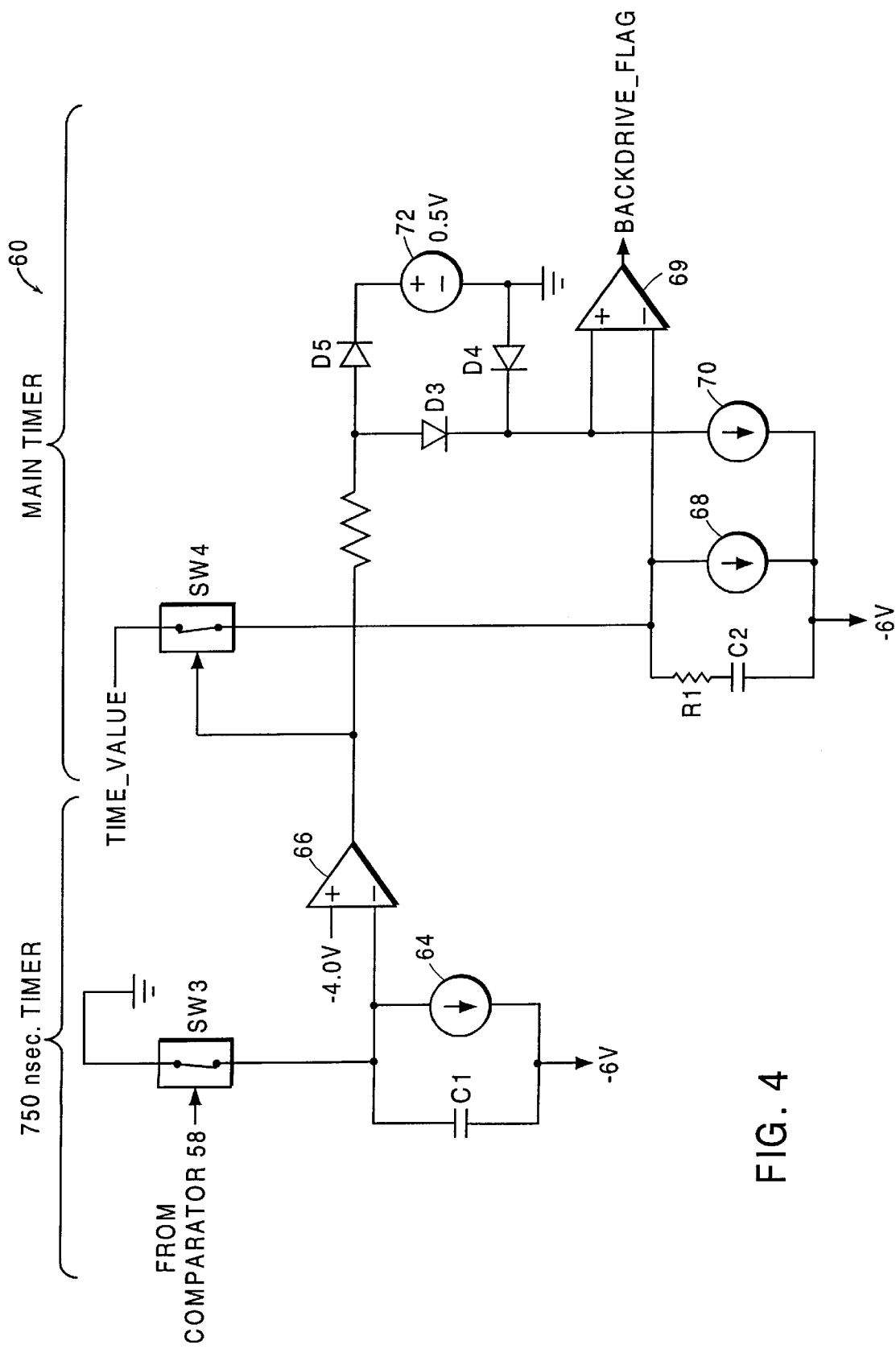
FIG. 4 is a simplified schematic diagram of a timer circuit included in the circuit of FIG. 2.

For back-drive limiting, a further comparator 58 compares the current-magnitude-indicating $R_{sense}$ voltage with a backdrive threshold CURRENT_VALUE generated by FIG. 1's limit-setting circuitry 57. When the sensor voltage across FIG. 2's $R_{sense}$ exceeds CURRENT_VALUE, comparator 58 asserts its output. This causes a timer 60, described in more detail in connection with FIG. 4, to begin measuring the backdrive current's duration. Timer 60 asserts its BACKDRIVE_FLAG output when comparator 58 has asserted its output for a period of time greater than a time limit represented by a TIME_VALUE voltage level that FIG. 1's level-setting circuitry 57 generates.

For a reason explained below, FIG. 2's timer circuit 60 divides its measured time interval into two sub-intervals. The first, relatively short sub-interval begins with the opening of FIG. 4's normally closed electronic switch SW3. The second, normally much longer sub-interval begins with the subsequent opening of a second normally closed electronic switch SW4 when the first sub-interval ends.

Specifically, the opening of SW3 in response to assertion of backdrive comparator 58's output permits a current source 64 to begin linearly discharging an interval-timing capacitor C1 toward −6 volts. After 750 nanoseconds, capacitor C1's upper terminal has fallen from ground potential, at which SW3 had held it when it was closed, to a potential of −4 volts. At that point a comparator 66's output switches from its unasserted, −6-volt level to its asserted, +1.2-volt level.

That assertion of comparator 66's output causes switch SW4 to open and permit a current source 68 to start linearly discharging another interval-timing capacitor C2. Before that assertion, capacitor C2's upper terminal, which provides the inverting input to a BACKDRIVE_FLAG-generating comparator 69, is held by FIG. 1's level-setting circuitry 59 at the duration-setting voltage level TIME_VALUE. (Capacitor C2 differs from the rest of FIG. 4's circuitry in that it typically is not included in FIG. 2's driver/sensor integrated circuit 55. Unlike capacitor C1, which is used for a very short-duration interval and is therefore small enough to be part of that integrated circuit, capacitor C2 is typically intended for durations as long as tens of milliseconds, so it is typically provided as a separate component.)

Comparator 69's non-inverting input is the voltage at the junction of two diodes D3 and D4. While comparator 66's output is still at its low, −6 volt level, D3 is back-biased, so comparator 69's non-inverting input is the −0.7 volt level that results from diode D4's being forward biased by a current source 70 and having its anode tied to ground. TIME_VALUE is always higher than −0.7 volt, so BACKDRIVE_FLAG is unasserted so long as switch SW2 is closed. This is as it should be, because assertion of BACKDRIVE_FLAG is an indication that the maximum backdrive duration has been exceeded.

When comparator 66's output goes high, the action of a 0.5-volt source 72 through a further diode D5 clamps D3's anode to 1.2 volts so that the diode drop across D3, which comparator 66's output now forward biases, results in a 0.5-volt level at the BACKDRIVE_FLAG comparator 69's non-inverting input port. Ordinarily, the TIME_VALUE level at which comparator 69's inverting input starts is higher than that, so BACKDRIVE_FLAG initially remains unasserted even though the backdrive threshold set by CURRENT_VALUE has been exceeded. But current source 68 causes capacitor C2 to discharge linearly from TIME_VALUE toward that 0.5-volt level. If the voltage on capacitor C2 reaches that level, comparator 69 asserts BACKDRIVE_FLAG and thereby indicates that backdriving should be interrupted.

The analog voltage TIME_VALUE thus sets the permitted backdrive duration. Specifically, so long as TIME_VALUE's voltage has been set to a value that exceeds 0.5 volt, the permitted backdrive duration τ is given by:

$$\tau = \frac{C_2}{I_{68}}(V_{TV} - 0.5 \text{ volt}) + 750 \text{ nsec},$$

where $V_{TV}$ is the voltage of the TIME_VALUE signal and $I_{68}$ is the current that current source 68 draws.

As this equation shows, the continuous-backdriving duration required to cause disablement depends only on the duration input TIME_VALUE. In other embodiments, though, it may additionally depend on other factors. For example, the quantity corresponding in some embodiments to source 68's discharge current may not be fixed, as it is in the illustrated embodiment; it may additionally depend on the backdrive current and/or other factors. In such a case, a greater backdrive current would result in a lower permitted backdrive duration. Such an arrangement can provide the backdrive and the short-circuit features in common circuitry. If the illustrated embodiment were modified to make current sensor 68's current depend on the difference between the $R_{SENSE}$ voltage and CURRENT_VALUE, for instance, the charging current may be so high when the short-circuit level is reached as to cause BACKDRIVE_FLAG essentially to be asserted immediately.

Also, the duration equation is based on the assumption that the backdriving is continuous. Of course, backdriving is more typically intermittent. When it is, the illustrated embodiment permits a greater cumulative backdrive time. Specifically, capacitor C2 is permitted to charge through resistor R1 between backdriving intervals. The time required to draw off the resultant charge thereby adds to the cumulative backdrive time needed to reach BACKDRIVE_FLAG comparator 69's threshold.

As was mentioned above, the TIME_VALUE signal's voltage $V_{TV}$ is ordinarily set to exceed 0.5 volt. But there may be times when the tester is to operate in a different mode, one in which it is merely to record the occurrence of backdrive levels, not really to time them. For that purpose, the TIME_VALUE signal's voltage $V_{TV}$ is set to a value less than 0.5 volt. In that case, the transition of comparator 66's output to its high level after 750 nanoseconds causes comparator 69's BACKDRIVE_FLAG output to go high immediately: BACKDRIVE_FLAG is asserted if the backdrive level is present for as little as 750 nanoseconds. The 750-nanosecond duration tends to filter out current-sensor noise but captures even single-vector-duration backdrive conditions if the rate of vector application is as high as, say, 1 MHz.

Figure 5:
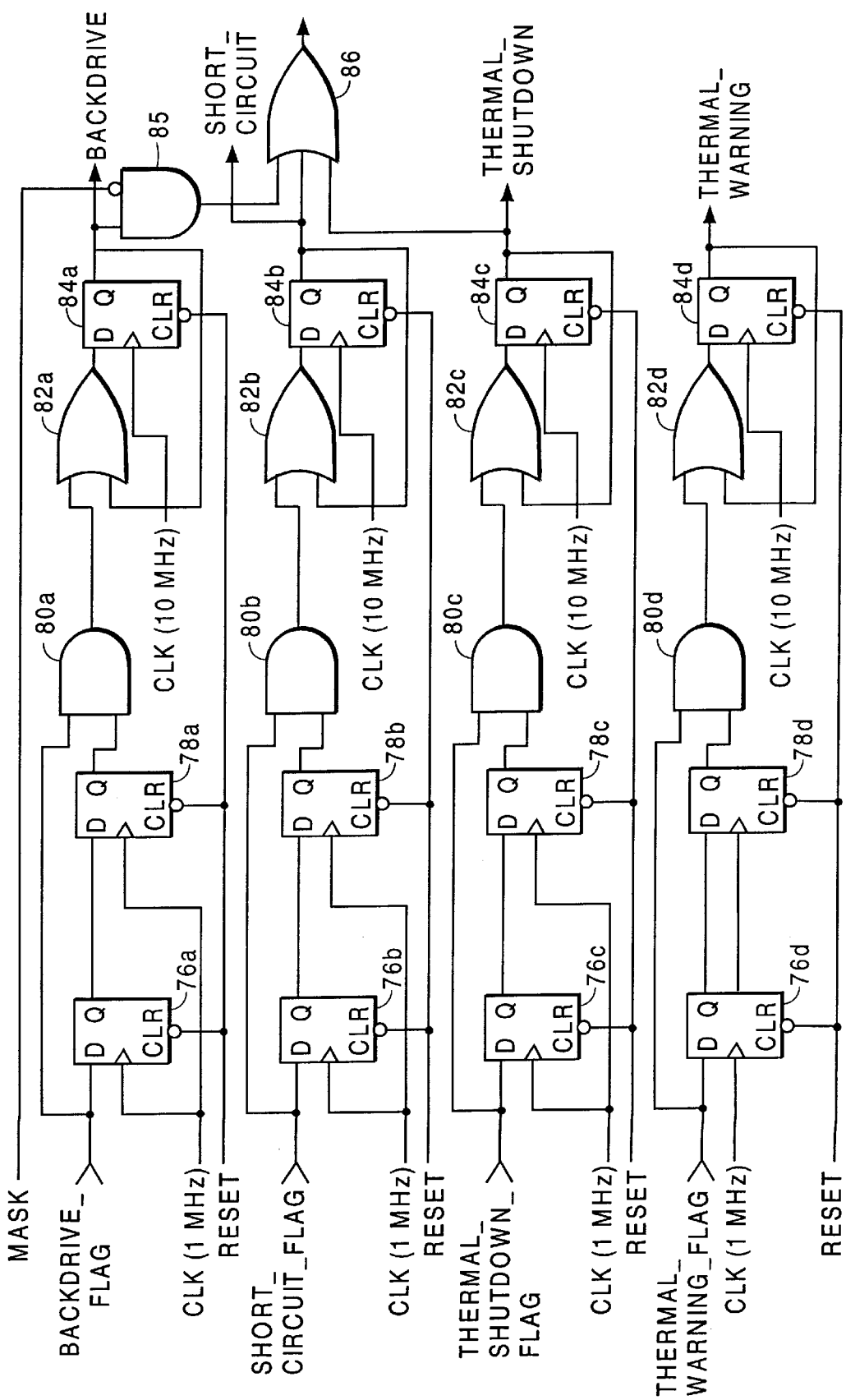
FIG. 5 is a logic diagram of a backdrive controller that FIG. 1's tester includes.

FIG. 2's BACKDRIVE_FLAG and SHORT_CIRCUIT_FLAG signals follow FIG. 1's path 72 to latching circuitry 74, which implements FIG. 5's logic. Part of that circuitry's purpose is to remember any of the flag signals' assertions until the CPU 30 has had a chance to poll it.

Specifically, the BACKDRIVE_FLAG signal is the input of a de-glitching circuit formed by FIG. 5's D-type flip-flops 76a and 78a and AND gate 80a. An OR gate 82a and a further D-type flip-flop 84a form a latch whose BACKDRIVE output assumes its asserted state when the de-glitched version of BACKDRIVE_FLAG becomes asserted. BACKDRIVE remains asserted when BACKDRIVE_FLAG thereafter returns to its unasserted state so that the CPU can check at its leisure for the backdrive occurrence.

Unless the CPU has caused a MASK signal to be asserted and thereby disable the backdrive-control feature, an AND gate 85 forwards the result to an OR gate 86. The decoder 44 (FIG. 1) receives gate 86's resultant asserted output. This causes the decoder to switch from its normal mode, in which the value of its TRI-STATE output (FIG. 2) is determined by the pin memory 38's output, to an excessive-backdrive mode, in which it asserts TRI-STATE even if the pin-memory output does not call for it to do so. As FIG. 2 indicates, this causes electronic switch SW3 to open and electronic switcher SW4 to close and thereby place the driver in its high-impedance state: the driver no longer drives the excessively backdriven node.

In some embodiments the pin memory, which ordinarily receives the digital-sensor outputs and stores their values, will additionally receive and store the BACKDRIVE_FLAG signal's values at successive clock times. This provides information that the user or appropriate software can use for diagnostic purposes.

FIG. 1's board controller 42 receives the ORed combination of this BACKDRIVE signal and those produced by the latching circuitry 74 (not shown) associated with the board's other driver/sensors. It can take any appropriate action in response, such as recording the event in a status register to the central processor 30 has access by way of bus 26. Typically, the sequencer 40 receives the wired-OR combination of such a register's output and the corresponding outputs of other boards' backdrive controllers. The CPU 30 can detect the occurrence of excessive backdriving during the last signal burst by observing the resultant sequencer status. It can then poll the board controllers' registers to find the pin or pins at which the excessive backdriving occurred and thereafter reset FIG. 5's BACKDRIVE latch by asserting flip-flop 84a's reset input.

Similar circuitry 76b, 78b, 80b, 82b, and 84b similarly de-glitches and latches the SHORT_CIRCUIT_FLAG signal and thereby generates a similar output SHORT_CIRCUIT, which similarly causes the driver to be disabled and can similarly be polled by the CPU.

Additionally, the integrated circuit in which the driver/sensor is implemented may include a temperature sensor, not shown in the drawings, that generates FIG. 5's THERMAL_SHUTDOWN_FLAG signal when the driver/sensor integrated circuit's temperature becomes excessive. Further circuitry 76c, 78c, 80c, 82c, and 84c generates a THERMAL_SHUTDOWN signal by de-glitching and latching THERMAL_SHUTDOWN_FLAG. THERMAL_SHUTDOWN causes the driver to be disabled, just as SHORT_CIRCUIT and BACKDRIVE do, and the CPU can similarly poll and reset it.

The temperature-sensor circuitry may also generate a further signal, THERMAL_WARNING_FLAG, to indicate that the driver/server has reached a lesser elevated temperature, which does not justify a shutdown but may make it prudent to take some other action. So circuitry 76d, 78d, 80d, 82d, and 84d, generates a THERMAL_WARNING signal by de-glitching THERMAL_WARNING_FLAG. This signal can be polled and reset, as the others can, but it does not cause the sensor's driver to be disabled.

At the end of a burst, the central processing unit 30 will typically perform a number of operations, such as checking pin-board flags that indicate whether node outputs were so expected, i.e., to determine whether the in-circuit test was successful. It may also re-configure the scanner to cause the driver/sensors to be coupled to different probed board nodes. In most cases, it will additionally reload the memory 38 with new vector components so as to prepare it for the next burst.

The central processing unit 30 is then ready to order sequencer 40 to begin the next burst. Before it does so, though, it determines whether a minimum inter-burst duration has been completed since the last burst. If not, it waits until that minimum has been completed. In accordance with the present invention, the central processor 30 bases its determination of what the minimum should be on the output of FIG. 2's current-sensing circuit and those associated with at least some other backdrive-capable digital drivers. The specific way in which the central processing unit 30 determines that minimum will vary from one embodiment to another. Typically, no minimum period will be imposed—i.e., the inter-burst duration will be only that required for necessary operations such as a memory loading rod scanner reconfiguration if the board controllers report that their polling revealed no asserted BACKDRIVE signals. In some embodiments, the occurrence of backdrive signal from any of the drivers will cause the central processing units to set the minimum duration to a predetermined relatively high value, such as nine times the last burst's duration. In other embodiments, a non-zero minimum will not be imposed unless a certain minimum number of drivers' BACKDRIVE signals were asserted. Other embodiments may be more elaborate. For example, the absolute or relative (to the previous burst) minimum duration may depend on, say, the number of drivers at which backdriving occurred during the previous burst. Others may set the minimum duration as a function of a sum of weight associated with the various drivers that performed backdriving during the previous burst. The weights may depend on say, the backdrive thresholds set for the different drivers.

In yet another approach, the pin memory 38 may be loaded during the burst not only with the digital sensor outputs but also with indications of whether backdriving is occurring during the corresponding clock interval. The minimum inter-burst interval could then be a function not only of the number of drivers that perform backdriving but also of the duration for which backdriving occurs during that burst.

A variation of these approaches can be used to shift some of the determination of minimum inter-burst time duration to the test-design process. Specifically, minimum inter-burst durations for a given test are determined by making backdrive measurements as the test is being designed and/or debugged. The various CURRENT_VALUE and TIME_VALUE quantities are then so set that a given driver's BACKDRIVE signal is asserted only if the amount of that driver's backdriving exceeds the amount on which the determination of its inter-burst duration is based. So the minimum inter-burst durations determined during test design are the minima imposed if no BACKDRIVE signals are asserted during the test. A greater, extended minimum duration is imposed only if at least one BACKDRIVE signal was asserted during the previous burst. (Some embodiments may require assertion of a certain minimum number of BACKDRIVE signals before they impose the extended minimum inter-burst durations.) Other approaches will also suggest themselves to those skilled in the art.

Although the invention has been described by reference to a single example, it can be implemented in a wide range of embodiments. As was observed above, for example, the backdrive duration can instead be specified as, say, a function of the excess of the measured current level over the backdrive threshold. Also, although we believe that the illustrated analog timer is particularly well suited to implementing the invention, the specified durations could instead be timed out by, say, a digital down counter.

It is therefore apparent that the test-generation and -execution flexibility that the present invention permits can be afforded in a wide range of embodiments. The present invention thus constitutes a significant advance in the art.

What is claimed is:

1. A circuit-board tester comprising:
   A) pin-memory circuitry operable to store vector data indicating whether to drive loads and what digital levels to drive the loads at and also operable to produce vector signal bursts representing the vector data that it has stored;
   B) a plurality of pin drivers, each of which includes an output port at which, when a load is coupled thereto, it drives the load in accordance with the vector signal bursts;
   C) current-sense circuitry for sensing currents driven by the pin drivers and generating backdrive outputs dependent thereon; and
   D) control circuitry that operates the pin-memory circuitry alternately to store vector data therein and to produce the signal bursts representative of the vector data thus stored, the control circuitry being responsive to the backdrive outputs selectively to impose minimum time intervals between successive bursts in accordance therewith.

2. A circuit-board tester as defined in claim 1 wherein:
   A) the vector data includes a set of pin data respectively associated with each pin driver;
   B) the pin-memory circuitry includes a separate pin memory respectively associated with each of the pin drivers, is operable to store the set of the pin data associated with the associated pin driver, and is also operable to produce a pin signal burst representing the pin data that it has stored; and
   C) each pin driver drives the load coupled thereto in accordance with the pin signal burst produced by its associated pin memory.

3. A circuit-board tester as defined in claim 2 wherein the current-sense circuitry includes a separate current sensor and duration circuit associated with each pin driver, each current sensor sensing the load current driven by its associated pin driver and applying to the associated duration circuit a current-level output indicative thereof, the backdrive outputs including a duration-circuit output that each duration circuit asserts when the current indicated by the current-level output applied thereto has continuously exceeded a respective backdrive threshold for a maximum backdrive duration.

4. A circuit-board tester as defined in claim 2 wherein the control circuit interval between first and second successive bursts is at least equal to an extended duration when the drivers' load currents have met a predetermined backdrive criterion and is less than the extended duration when the current-signal outputs indicate that they do not.

5. A circuit-board tester as defined in claim 4 wherein:
   A) the drivers' load currents meet the predetermined backdrive criterion during a given burst if the drive current of each of a predetermined number of the pin drivers has continuously exceeded a respective backdrive-current threshold for more than a backdrive minimum duration during the given burst; and
   B) the drivers' load currents do not meet the predetermined backdrive criterion during a given burst if every pin driver's load current has remained below the backdrive-current threshold during the given burst.

6. A circuit-board tester as defined in claim 5 wherein the drivers' load currents do not meet the predetermined backdrive criterion during a given burst if no pin driver's load current has exceeded a respective backdrive range and none has occupied it for more than the backdrive minimum duration.

7. A circuit-board tester as defined in claim 6 wherein the drivers' load currents meet the predetermined backdrive criterion during a given burst if the drive current of any pin driver has continuously exceeded a respective backdrive-current threshold for more than the backdrive minimum duration during the given burst.

* * * * *